March 5, 1963 J. B. SCHULTZ ETAL 3,080,529

PLURAL INPUT SIGNAL TRANSLATING SYSTEM

Filed June 13, 1960

INVENTORS
JOHN B. SCHULTZ &
BY GERALD E. THERIAULT

Eugene M. Whitacre

ATTORNEY

United States Patent Office 3,080,529
Patented Mar. 5, 1963

3,080,529
PLURAL INPUT SIGNAL TRANSLATING SYSTEM

John B. Schultz, Haddonfield, and Gerald E. Theriault, Haddon Heights, N.J., assignors to Radio Corporation of America, a corporation of Delaware Filed June 13, 1960, Ser. No. 35,650
11 Claims. (Cl. 330—38)

This invention relates to signal translating systems and more particularly to signal translating stages for simultaneously and independently processing at least two signals which may have materially different frequencies.

It has been heretofore proposed that a signal amplifying stage may be used to amplify two or more signals of different frequencies. For example, in broadcast receivers, a single amplifying stage may be used to amplify signal modulated intermediate frequency (IF) signals as well as the detected audio frequency signals. One problem encountered in the design of amplifying stages of this type is that the operating point of the stage must be the same for both signals, whereas for optimum system efficiency it may be desirable to control the operating point or the gain of the stage for one of the signals without appreciably affecting the operating point of the stage for the other of the signals.

It is accordingly an object of this invention to provide an improved signal handling system for simultaneously processing at least two different signals.

It is accordingly an object of this invention to provide an improved signal hanling system for simultaneously processing at least two different signals.

Another object of this invention is to provide an improved amplifier stage for signals of two different frequencies wherein the gain of the stage for one of the frequencies may be controlled without substantially affecting the gain of the stage for the other of the frequencies.

A further object of this invention is to provide an improved signal translating stage for two different signals wherein the stage may be biased for efficient translation of both signals, and the operating point of the stage for one of the signals may be readily controlled without substantially affecting the operating point for the other signal.

A signal translating stage in accordance with the invention includes a transistor device with the usual base and collector electrodes and a pair of emitter electrodes. The circuit includes connections for applying a first signal wave between a first of the emitter electrodes and the base electrode of the transistor device. Further connections are provided for applying a second signal wave between a second of the emitter electrodes and the base electrode of the transistor device. One of said emitter electrodes is maintained at a relatively fixed voltage. Output circuit means for the first and second signal waves are coupled to the collector electrode. An unbypassed impedance element is connected in the emitter current path of the first emitter electrode, but not in the input signal curent path of the first signal wave applied to the first emitter electrode so that the impedance element is not degenerative. The impedance element is selected to provide substantial isolation between said first and second emitter electrodes at the frequency of the signal waves to be gain controlled and to provide a low enough impedance with respect to the impedance presented by the output circuit to said first signal wave to prevent excessive power loss of the first signal in the impedance element. The circuit described provides the additional advantage of permitting the amplifier to be operated in the common emitter mode for both signal waves. However, because of the substantially fixed voltage on the other emitter electrode, the current through that electrode will change much more rapidly in response to changes in the gain controlling voltage. The resulting circuit provides good gain control for the signal wave applied between the base electrode and the emitter electrode that is maintained at a fixed potential with almost constant gain for the other signal wave.

The novel features that are considered to be characteristic of this invention are set forth with particularity in the appended claims. The invention itself, however, both as to its organization and method of operation as well as additional objects and advantages thereof, will best be understood from the following description when read in connection with the accompanying drawings in which:

Figure 1:
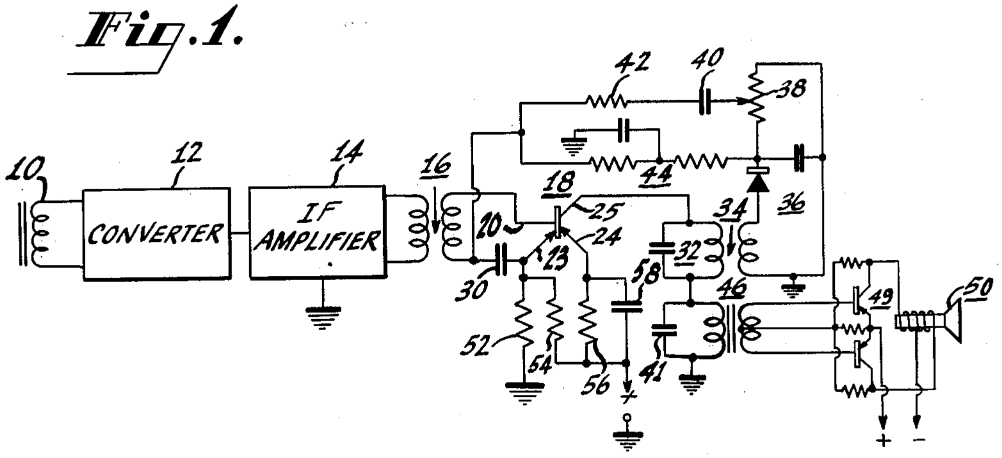
FIGURE 1 is a schematic circuit diagram of a radio signal receiver including a signal translating stage in accordance with the invention.

The transistor receiver shown schematically in FIGURE 1 includes an antenna 10, such as a ferrite loop antenna, which is coupled to a converter stage 12. The converter stage 12 may comprise separate mixer and oscillator portions, or a single self-oscillating converter stage, either of which is operable to heterodyne the incoming signal molulated radio frequency waves with the local oscillator signal to produce a corresponding signal of intermediate frequency. The resulting intermediate frequency (IF) signal is then applied to an IF amplifier stage 14 for amplification. Signals amplified by the IF amplifier 14, are coupled through an IF transformer 16 to a multiple frequency amplifier stage 18. The multiple frequency amplifier stage 18 simultaneously amplifies both IF and audio frequency signals, and is responsive to a gain controlling potential to control the gain of the IF signal without affecting the gain of the audio signal.

Figure 2:
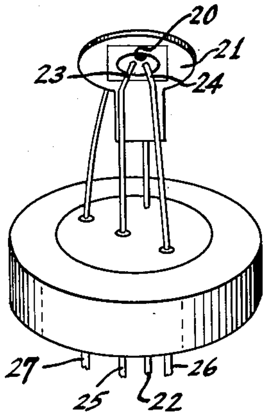
FIGURE 2 is a perspective view greatly enlarged of a double emitter transistor which may be used in signal translating circuits embodying the invention.

The stage 18 includes a double emitter drift transistor device which may be of the type shown in FIGURE 2. The device which is normally encapsulated, includes a base 20 that is conductively connected by a conducting mounting structure 21 supported on an externally accessible connecting lead 22. A first emitter electrode 23 and a second emitter electrode 24 are alloyed onto one side of the base, and a collector electrode, not shown, is alloyed onto the opposite side of the base. The first and second emitter electrodes 23 and 24 and the collector electrode are accessible externally by means of connecting leads 25, 26 and 27 respectively.

The base 20 includes a diffused "N" type region with varying impurity concentration. The impurity distribution is a maximum at the emitter junctions and decreases to a substantially constant value near the collector junction. Such an impurity distribution provides the advantages of better frequency response, higher gain, and lower feedback capacitances. The collector periphery encompasses the two emitters and thus assures the collection of carriers injected from either emitter. To prevent interaction between the circuits connected to the two emitters due to the low resistance of the maximum impurity region, a portion of the area between the two emitters, or around one of the emitters, is etched through to a less concentrated impurity region of higher resistivity.

An IF signal developed across the secondary winding of the IF transformer 16 is applied between the base electrode 20 and the first emitter electrode 23 of the double emitter device. A capacitor 30 which is selected to provide a relatively low impedance to signals of intermediate frequency, but a high impedance to signals of lower frequency such as audio frequency connects one side of the secondary winding to the emitter electrode 23 to provide direct current blocking. The IF signal is amplified by the multiple frequency amplifier 18 and is developed across a tuned circuit 32 which includes the primary winding of an intermediate frequency transformer 34, and is coupled through the transformer to a second detector circuit 36.

The second detector circuit 36 derives the audio frequency modulating signal from the IF signal, and causes the audio frequency signal to be developed across a volume controlling resistor 38. A variable tap on the volume controlling resistor 38 is connected through an audio coupling capacitor 40 and an isolating resistor 42 to the base electrode of the multiple frequency amplifying stage 18. The second detector circuit 36 also provides a D.C. voltage representative of the average signal level of the received wave. This voltage is filtered by a resistance capacitance filter network 44 before being applied to the base electrode 20 of the multiple frequency amplifier stage 18 as an automatic gain control (AGC) voltage.

The audio frequency signals applied to the multiple frequency amplifier stage 18 are amplified and developed across the primary winding of an audio output transformer 46 which is bypassed for intermediate frequency signals by a capacitor 41. Audio frequency signals are coupled through the transformer 46 to a push-pull audio output stage 49 that drives a sound reproducing device 50.

The AGC voltage applied to the multiple frequency amplifier stage 18 controls the gain of the stage for IF signals, but does not appreciably affect the gain of the stage for audio frequency signals. This action is achieved by connecting the emitter electrode 23, which is individual to the intermediate frequency amplifier circuit portion, to the junction of a pair of resistors 52 and 54 which are connected between ground and the positive terminal of an operating potential supply, not shown. The resistors 52 and 54 are of a value such that the emitter electrode 23 is maintained at a substantially fixed potential. Although the resistors 52 and 54 are unbypassed, they are not degenerative inasmuch as they are not in the IF input signal current path. The emitter electrode 24 which is individual to the audio frequency amplifier circuit portion is connected through a resistor 56, which is bypassed for audio frequencies by a capacitor 58, to the positive terminal of the operating potential supply source.

As the received signal level increases, the AGC voltage applied to the base electrode 20 tends to become more positive. Since the emitter electrode 23 is maintained at the relatively fixed potential by the voltage divider 52 and 54 such changes in the AGC voltage cause the current in the emitter electrode 23 to drop rapidly, and thus provide a substantial reduction in gain for the IF signal. However, these changes in AGC voltage produce a less rapid drop in current through the second emitter electrode 24 because the change in current in this electrode is proportional to the change in the base voltage. In other words, as the base 20 voltage changes, the current in the emitter electrode 24 and hence the resistor 56 is also changed. The voltage change across the resistor 56 is in a direction that tends to counteract the affect of the applied change in base voltage. In summary, a change in base 20 voltage produces a much greater change of current in the emitter electrode 23, thus providing substantial control of the IF signal gain without appreciably affecting the audio frequency signal gain. By way of example it has been found that a .15 v. change in base voltage in the reverse direction will reduce the emitter 23 current to zero while producing only a 15% change in the emitter 24 current.

The emitter electrode 23 is isolated from the emitter electrode 24 for IF signals by the parallel combination of the resistors 52 and 54. The resistor 54 is connected to the emitter 24 through the low impedance of the bypass capacitor 58, and the resistor 52 is connected to the emitter 24 through the low impedance of the operating potential source and the capacitor 58. The isolation is necessary to prevent IF signals from being applied between the base 20 and emitter 24 which would permit amplification of the IF signal without gain control. The combined resistance of the resistors 52 and 54 is smaller than the impedance of the output circuit 32 to IF signals so as to prevent excessive loss of IF signal power.

Figure 3:
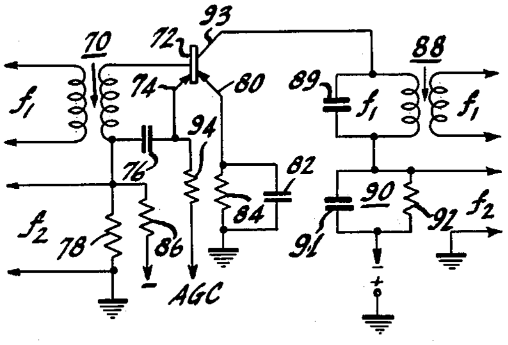
FIGURE 3 is a schematic circuit diagram of a multiple frequency amplifier stage embodying the invention.

Another embodiment of a multiple frequency amplifier in accordance with the invention is shown in FIGURE 3. A signal of frequency $f_1$ is applied by way of a coupling transformer 70 between the base electrode 72 and the emitter electrode 74 of a double emitter transistor device which may be the general type shown in connection with FIGURE 2. The coupling capacitor 76 which couples emitter electrode 74 to the secondary winding of the transformer 70 provides lower impedance to signals of frequency $f_1$ and much higher impedance to signals having a frequency $f_2$ substantially below that of frequency $f_1$. Signals of frequency $f_2$ are developed across a resistor 78 which is connected between the junction of the secondary winding of the transformer 70 and the capacitor 76 and ground. The second emitter 80 of the transistor device is connected to ground through the parallel combination of a resistor 84 and a bypass capacitor 82. Signals of frequency $f_2$ are thus effectively applied between the base electrode 72 of the transistor device and a second emitter electrode 80 by way of a signal bypass capacitor 82.

The base 72 of the transistor device is biased to the desired operating point by a voltage divider including a resistor 86 which is connected from the high signal potential side of the resistor 78 and the negative terminal of the operating potential supply source for the signal translating stage. An output circuit for the signals of frequency $f_1$ includes an output transformer 88 which is tuned to frequency $f_1$ by a capacitor 89. A second output circuit 90 for signals of frequency $f_2$ includes a load resistor 92 and a shunt capacitor 91 which provides a low impedance for signals of frequency $f_1$ but a high impedance for signals of frequency $f_2$ compared to the resistance of resistor 92. The two output circuits 88 and 90 are connected in series between the collector electrode 93 and the negative terminals of the operating potential supply source, the positive terminal of which is grounded.

Signals of frequency $f_1$ are gain controlled by an AGC potential applied to the emitter electrode 74 through a resistor 94. The emitter 74 is effectively isolated from the emitter electrode 80 for signals of frequency $f_1$ primarily by virtue of the resistance of the resistors 78 and 86. This isolation minimizes the amount of signal at frequency $f_1$ developed between the base 72 and the emitter 80 of the transistor device. Thus as the AGC voltage varies, the gain of the device for signals of frequency $f_1$ is changed without substantially affecting the gain of the device for frequency $f_2$ which are applied between the base 72 and the emitter electrode 80. This is because the AGC voltage is only developed between the base 72 and the emitter electrode 74 and does not appear between the base electrode 72 and the emitter electrode 80.

Having described my invention, what is claimed is:

1. A signal translating stage for simultaneously processing first and second signals comprising the combination of a transistor device having a first emitter electrode, a second emitter electrode, a base electrode, and a collector electrode, input circuit means for a first signal connected between said base and said first emitter electrode, input circuit means for a second signal connected between said base and said second emitter electrode, means for maintaining said first emitter electrode at a substantially fixed, alternating and direct current potential, and output circuit means for said first and second signals connected between said collector and said first and second emitter electrodes.

2. A signal translating stage for simultaneously processing a first signal of one frequency and a second signal of a substantially different frequency comprising the combinaton of a transistor device having a first emitter electrode, a second emitter electrode, a base electrode, and a collector electrode, input circuit means for a first signal of one frequency connected between said base and said first emitter electrode, input circuit means for a second signal of a second frequency substantially different from said first frequency connected between said base and said second emitter electrode, means connecting said first and second emitter electrodes to maintain a substantially fixed potential at said first emitter electrode and provide a high impedance path therebetween for signals of said first frequency, circuit means for applying a gain control potential to said base electrode whereby the gain of said stage for said first signals is controlled without appreciably affecting the gain of said stage for said second signals, and output circuit means for signals of said first and second frequencies connected to said collector electrode.

3. A signal translating stage for first and second signals comprising the combination of a transistor device having a first emitter electrode, a second emitter electrode, a base electrode, and a collector electrode, input circuit means for a first signal connected between said base and said first emitter electrode, input circuit means for a second signal connected between said base and said second emitter electrode, output circuit means for said first and second signals connected to said collector electrode, means connected to maintain a substantially fixed potential at said first emitter electrode, and circuit means for applying a gain control potential to said base electrode whereby the gain of said stage for said first signals is controlled without appreciably affecting the gain of said second signals.

4. A signal translating stage for first and second signals comprising the combination of a transistor device having a base electrode including opposite sides, a first and second emitter electrodes alloyed onto one side of said base electrode and a collector electrode alloyed onto the opposite side of said base electrode, said base electrode including a diffused impurity region with maximum impurity concentration on the side of said base electrode to which said emitter electrodes are alloyed and decreasing impurity concentrations in a direction toward said collector electrode, said base electrode having a portion of the surface thereof removed between said emitter electrodes to a depth to materially increase the resistivity between said emitter electrodes as compared to the resistivity without said portion removed, input circuit means for a first signal connected between said base and said first emitter electrode, input circuit means for a second signal connected between said base and said second emitter electrode, output circuit means for said first and second signals connected to said collector electrode, means connected to maintain a substantially fixed potential at said first emitter electrode, and circuit means for applying a gain control potential to said base electrode whereby the gain of said stage for said first signals is controlled without appreciably affecting the gain of said stage for said second signals.

5. A signal translating stage for first and second signals comprising the combination of a transistor device having a first emitter electrode, a second emitter electrode, a base electrode, and a collector electrode, input circuit means for a first signal connected between said base and said first emitter electrode, input circuit means for a second signal connected between said base and said second emitter electrode, means providing a source of gain control potential connected to said base, means for maintaining said first emitter electrode at a relatively fixed potential in response to changes in said gain control potential, and impedance means providing degeneration for direct current connected in common with the input and output circuits for said second signal to permit said second emitter electrode potential to vary in response to a change in said gain control potential, and output circuit means for said first and second signals connected to said collector electrode.

6. A signal translating stage for first and second signals comprising the combination of a transistor device having a base electrode including opposite sides, a first and second emitter electrodes alloyed onto one side of said base electrode and a collector electrode alloyed onto the opposite side of said base electrode, said base electrode including a diffused impurity region with maximum impurity concentration on the side of said base electrode to which said emitter electrodes are alloyed and decreasing impurity concentrations in a direction toward said collector electrode, said base electrode having a portion of the surface thereof removed between said emitter electrodes to a depth to materially increase the resistivity between said emitter electrodes as compared to the resistivity without said portion removed, input circuit means for a first signal connected between said base and said first emitter electrode, input circuit means for a second signal connected between said base and said second emitter electrode, means providing a source of gain control potential connected to said base, means interconnecting said base and said first and second emitter electrodes to provide a much greater change in the current through said first emitter electrode than through said second emitter electrode in response to a change in said gain control potential, and output circuit means for said first and second signals connected to said collector electrode.

7. A signal translating stage for simultaneously processing two signals of a first and second substantially different frequencies comprising the combination of a transistor device having a first emitter electrode, a second emitter electrode, a base electrode, and a collector electrode, input circuit means for a signal of said first frequency connected between said base and said first emitter electrode, input circuit means for a signal of said second frequency connected between said base and ground, a voltage divider connected between an operating potential supply terminal and ground, a resistor connected between said second emitter and ground, said first emitter connected to a point on said voltage divider which presents a relatively high impedance path to ground for signals of said first frequency, output circuit means for signals of said first frequency and output circuit means for signals of said second frequency connected in series between said collector electrode and ground, and means providing a source of gain control potential connected to said base whereby the gain of said stage is controlled for signals of said first frequency without appreciably affecting the gain of said stage for signals of said second frequency.

8. A signal translating stage for simultaneously processing two signals of materially different frequencies comprising the combination of a transistor device having a first emitter electrode, a second emitter electrode, a base electrode, and a collector electrode, input circuit means for a signal of a first frequency, a coupling capacitor having one terminal connected to said first emitter electrode, said input circuit means connected between said base and the other terminal of said coupling capacitor, means providing a source of operating potential, means for maintaining said first emitter at a substantially fixed voltage, input circuit means for a signal of a second frequency which is materially different from said first frequency coupled between said first input circuit means and said source of operating potential, a resistor connected between said source of operating potential and said second emitter, a capacitor connected between said source of operating potential and said second emitter to provide a bypass impedance for signals of said first and second frequencies, a first output circuit for signals of said first frequency and a second output circuit for signals of said second frequency connected between said collector electrode and said source of operating potential, the circuit path between said first and second emitter electrodes providing relatively high impedance to signals of said first frequency, and means providing a source of gain control potential connected to said base electrode.

9. A signal translating stage for processing first and second signals and providing gain control of one of said signals comprising the combination of a transistor device for a first emitter electrode, a second emitter electrode, a base electrode and a collector electrode, input circuit means for a first signal connected between said base and said first emitter electrode, input circuit means for a second signal connected between said base and said second emitter electrode, means for maintaining one of said emitter electrodes at a substantially fixed potential with respect to a point of reference potential for said stage including an impedance element connected in the emitter current path of said first emitter electrode, output circuit means for said first and second signals coupled between said collector electrode and said first and second emitter electrodes, said impedance element selected to provide a substantial isolation between said first and second emitter electrode at the frequency of the signal waves to be gain controlled, and to provide a low impedance with respect to the impedance presented by said output circuit to said first signal wave, and means providing a source of gain control potential connected to said base electrode to control the gain of signals applied between said base and the electrode which is maintained at a relatively fixed voltage without appreciably affecting the gain of said stage for the signals connected between said base and the other of said emitter electrodes.

10. A signal translating system for simultaneously amplifying a first signal of one frequency and a second signal of substantially different frequency, comprising in combination, a transistor device having first and second emitter electrodes, a base electrode and a collector electrode, first input circuit means for signals of said one frequency, first output circuit means for signals of said one frequency, second input circuit means for signals of said different frequency and second output circuit means for signals of said different frequency, means connecting said first input circuit means between said first emitter and base electrodes, means connecting said second input circuit means between said second emitter and base electrodes, means connecting said first and second output circuit means in series with said collector electrode, means for maintaining one of said first emitter and base electrodes at a substantially fixed D.-C. potential so that said stage operates as a common emitter amplifier for signals of said one frequency, the circuit impedance between said first and second emitter electrodes to signals of said one frequency being sufficiently high to prevent substantial translation of signals of said one frequency as a result of current flow at said one frequency between said base and second emitter electrodes.

11. In a superheterodyne signal receiver of the type including a second detector, a combined intermediate frequency and audio frequency amplifier circuit comprising a transistor device having a first emitter electrode a second emitter electrode a base electrode and a collector electrode, intermediate frequency input circuit means coupled between said base and first emitter electrodes, intermediate frequency output circuit means connected to said collector electrode, means coupling said intermediate frequency output circuit to said second detector wherein said intermediate frequency signals are demodulated to provide an audio frequency signal, an audio frequency signal input circuit coupled between said base and second emitter electrodes, means for applying said audio frequency signal to said audio frequency signal input circuit, an impedance element providing degeneration for direct current and connected in common with the audio frequency signal input and output circuits, means for maintaining the potential of one of said first emitter and base electrodes substantially constant, and means for applying an automatic gain control signal to the other of said base and emitter electrodes.

References Cited in the file of this patent

UNITED STATES PATENTS 2,709,787 Kircher ---------------- May 31, 1955

UNITED STATES PATENT OFFICE
CERTIFICATE OF CORRECTION

Patent No. 3,080,529 March 5, 1963

John B. Schultz et al.

It is hereby certified that error appears in the above numbered patent requiring correction and that the said Letters Patent should read as corrected below.

Column 1, lines 29, 30 and 31, strike out "It is accordingly an object of this invention to provide an improved signal handling system for simultaneously processing at least two different signals."; column 2, line 28, for "molulated" read -- modulated --; column 5, line 38, after "said" insert -- stage for said --.

Signed and sealed this 1st day of October 1963.

SEAL)
Attest:

ERNEST W. SWIDER
Attesting Officer

DAVID L. LADD
Commissioner of Patents